United States Patent [19]
Fukasawa et al.

[11] Patent Number: 5,367,468
[45] Date of Patent: Nov. 22, 1994

[54] DESIGN AID METHOD AND DESIGN AID APPARATUS FOR INTEGRATED CIRCUITS

[75] Inventors: Takayuki Fukasawa, Tiba; Kunihiko Yamagishi; Masatoshi Sekine, both of Kanagawa, all of Japan

[73] Assignee: Kabushiki Kaisha Toshiba, Kawasaki, Japan

[21] Appl. No.: 657,775

[22] Filed: Feb. 21, 1991

[30] Foreign Application Priority Data

Feb. 21, 1990 [JP] Japan .................................. 2-38352
Nov. 29, 1990 [JP] Japan .................................. 2-325730

[51] Int. Cl.$^5$ ............................................. G06F 15/60
[52] U.S. Cl. .................................. 364/490; 364/489; 364/488
[58] Field of Search ................. 364/488, 489, 490, 491

[56] References Cited

U.S. PATENT DOCUMENTS

| | | | |
|---|---|---|---|
| 4,613,940 | 9/1986 | Shenton et al. | 364/490 |
| 4,651,284 | 3/1987 | Watanabe et al. | 364/491 |
| 4,700,317 | 10/1987 | Watanabe et al. | 364/488 |
| 4,703,435 | 10/1987 | Darringer et al. | 364/489 |
| 4,922,432 | 5/1990 | Kabayashi et al. | 364/490 |
| 5,005,136 | 4/1991 | Van Berkel et al. | 364/490 |
| 5,095,441 | 3/1992 | Hopper et al. | 364/489 |

OTHER PUBLICATIONS

"Methods Used in an Antomatic Logic Design Generator (ALERT)," by Friedman et al., IEEE Trans. on Computer, vol. C-18, No. 7, Jul. 1969, pp. 593-614.
"The VLSI Design Antomation Assitant: What's in a Knowledge Base" by Kowalski et al., IEEE 22nd Design Antomation Conf., 1985, pp. 252-257.
"Natural-Language Interfaces" by Elain Rich, IEEE—Computer, Sep. 1984, pp. 39-47.

*Primary Examiner*—Vincent N. Trans
*Attorney, Agent, or Firm*—Foley & Lardner

[57] ABSTRACT

Disclosed is a design aid apparatus for integrated circuits, which includes an input section for inputting design data, concerning a circuit to be designed, by means of diagrams or by means of language descriptions; a design section for designing a circuit in accordance with language input design data so as to prepare language design circuit data, and for preparing diagram design circuit data corresponding to the language design circuit data, or for designing a circuit in accordance with diagram input design data so as to prepare diagram design circuit data, and for preparing language design circuit data corresponding to the diagram design circuit data; and a holding section for storing and holding both the language design circuit data and the diagram design circuit data from the design section.

5 Claims, 15 Drawing Sheets

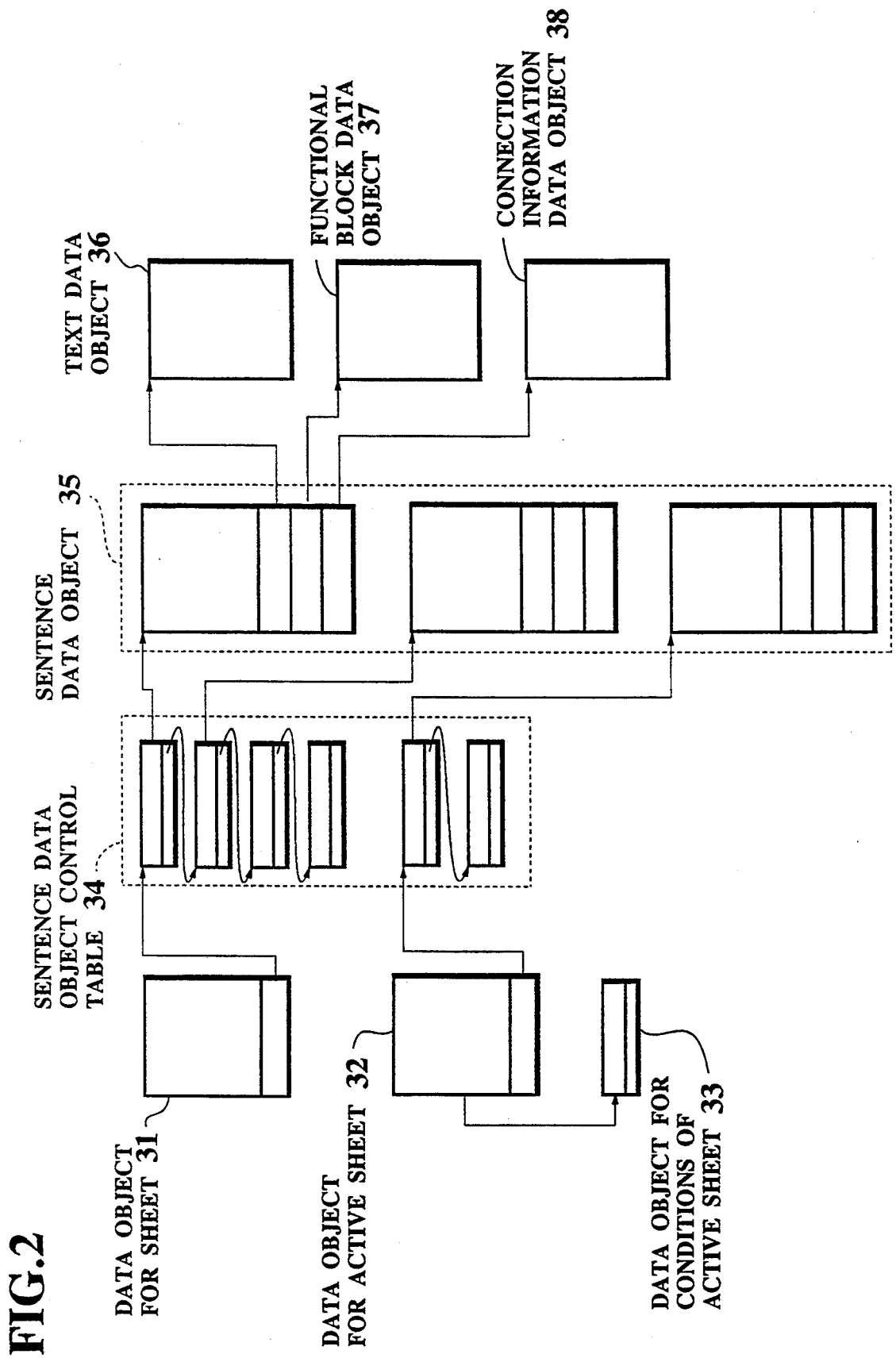

SHEET

ACTIVE SHEET

IF A THEN
  S3=S1&S2 ;
  S4=S3 ;
ENDIF ;

C1 : COND1
C2 : COND2 & COND3 ! COND4
C3 : COND5
C4 : COND6 & COND7
C5 : COND8

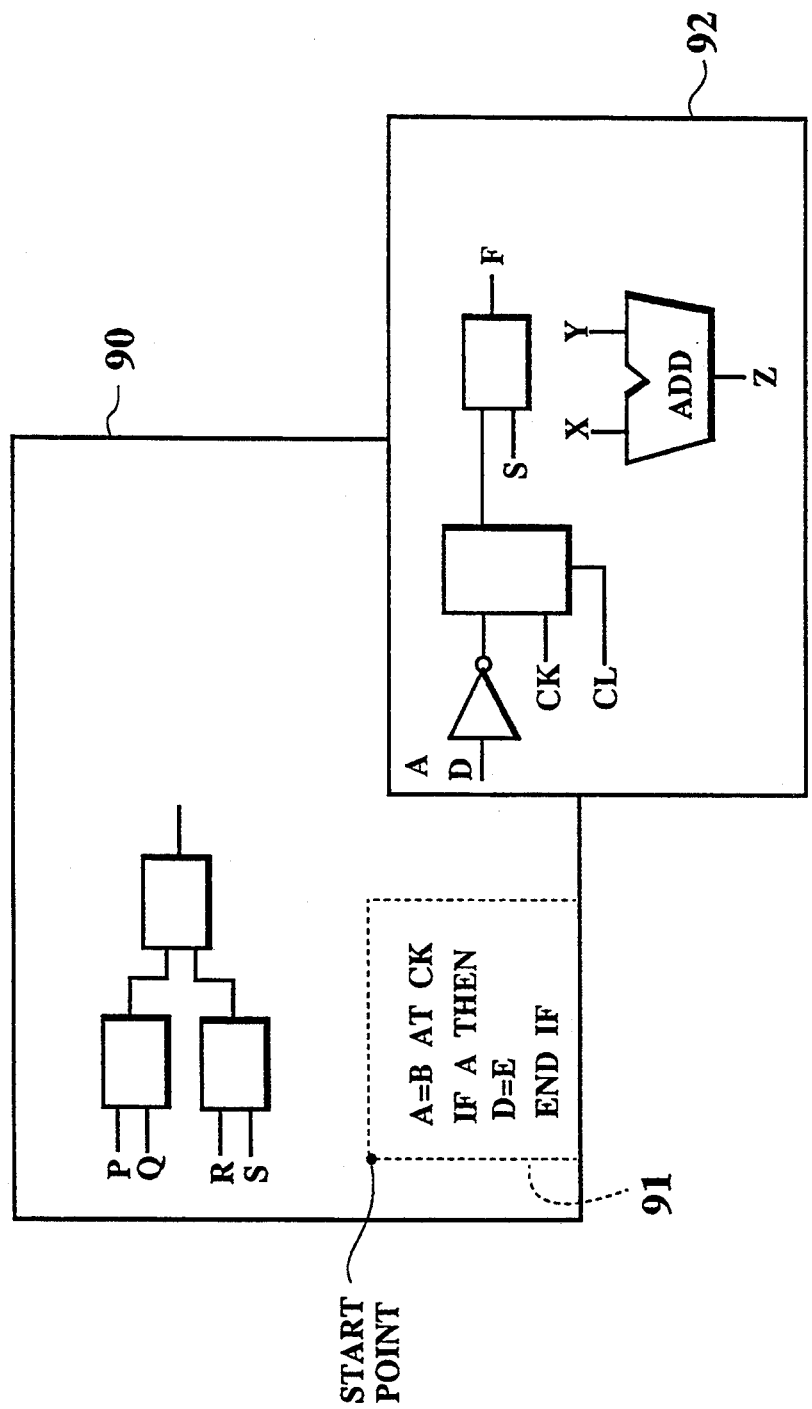

DESIGN AID METHOD AND DESIGN AID APPARATUS FOR INTEGRATED CIRCUITS

BACKGROUND OF THE INVENTION

1. Field of the Invention

The present invention relates to a design aid method and an design aid apparatus for facilitating design of integrated circuits, and particularly to an LSI design aid method and an apparatus thereof for facilitating and shortening such design work, which can realize data input onto the same editorial image plane by means of both diagrams and texts while making these two kinds of data be constructionally related to one another.

2. Description of the Prior Art

In conventional methods for designing integrated circuits by aid of computers, data input by means of diagrams and text description based on a language in accordance with a predetermined grammar is generally used.

In such a design method, since each integrated circuit is designed with aid of computers, the method of data input depends on processing ability of an input tool to be used therein. However, since current input tools for data input by means of diagrams, such as graphic editors, have insufficient data input ability, in the initial step of designing an integrated circuit, inputting data by means of text description has been exclusively used.

Using text description methods, it is possible to express a wide variety of circuit states from circuit structures to abstract circuit states and algorithms under various conditions. Text description methods also allow a series of control systems generally having a complex structure for controlling the data path of the design circuit to be clearly expressed, so that it becomes unnecessary to design a circuit for the control system separately.

However, in the text description input method, since only character strings are displayed on the monitor, it is difficult for a designer to understand the contents at sight. Therefore, it is difficult to grasp the whole structure and operation of a circuit to be designed, so that it becomes also difficult to understand the data flow in the data path. Thus, the circuit structure and operation can not be satisfactorily visually verified by this method.

Moreover, when the text description input method is used, it is necessary to select one language suitable for each design specification from a plurality of languages and to master the grammar of the language. Therefore, it takes much time to make a design using this method.

Accordingly, methods of inputting data by means of a diagram input tool have been considered recently.

According to such a diagram input method, since a circuit to be designed is displayed on the monitor as a diagram, it is easy for a designer to understand the structure and state of the circuit. Therefore, it becomes possible to grasp the whole structure of the circuit, and also possible to satisfactorily carry out visual verification of the circuit operation.

However, as mentioned above, methods of inputting data by means of diagram input tool are still unsatisfactory in that the input work thereof is complex as compared with the text description input method. Moreover, as compared with the text description input method, it is difficult for such a diagram input method to express highly abstract concepts concerning circuit states and algorithms.

In the diagram input method, design data are divided into data sheets corresponding to each design process. The division of a design circuit into data sheets is carried out based on the physical structure thereof. However, it is impossible to divide based on the concepts of the circuit states and signals flowing therein.

In the diagram input method, the above-mentioned control system must be provided in a circuit to be designed and the data path system and the control system must be expressed together in one circuit diagram, so that the discrimination therebetween is very difficult.

An apparatus which uses both the diagram input method and the text description input method has been recently proposed. However, in such an apparatus, even though it becomes possible to carry out data input by means of both of these methods, it is not still impossible to carry out data edition on the same editorial image plane. Therefore, it is necessary to provide separate design editors for these two method. Because the data inputted by the diagram input method and those inputted by the text description input method have no relation with one another, it is very difficult to facilitate the design work.

As stated above, in the conventional LSI design aid apparatus which uses either the diagram input method or the text description input method, it is very difficult to facilitate the design work.

On the other hand, in the apparatus which uses both of the diagram and the text description input method, the design editors and data construction each corresponding to the respective methods must be provided independently. Therefore, it is impossible to grasp the mutual relation between data inputted by the respective methods.

When text descriptions and diagrams are inputted on the same image plane, diagrams are inputted onto a description input area, or a description input area is designated in a diagram input area, so as to input description data into the designated area. In the former case, since character strings are all dealt with as data in the description input area, positions where characters are to be inputted are restricted by the character pitch specified in the description area, so that it is not permissible to input characters to any given position. In the latter case, each description input area is designated in each diagram input area at any given position with any given size, so as to input description data thereto. In such a case, the designated area is dealt with as one diagram on a corresponding diagram input area, otherwise it is designated as a completely new window.

When dealt with as one diagram on a diagram input area, the description input area is fixed, and it is impossible to input data on the character number per one line or line number which exceeds the designated area. To make this possible, it is necessary to provide some process for area extension. Moreover, in such a case, if the diagram is enlarged or reduced in size, the size of inputted characters must be changed in accordance with the change of diagram. Thus, when enlarged excessively, it becomes difficult to understand all the characters in sight, and when reduced extremely, it becomes difficult to read the characters.

On the other hand, when the above-mentioned designated area is dealt with as a completely new window, each description input area is completely independent of diagram input areas. Thus, there is no positional relation between these two kinds of areas. Therefore, it is impossible to arrange diagrams having some relation to some description in the vicinity of the description.

In the text description input method, each description should be expressed with a language in accordance with a predetermined grammar. Therefore, in some conventional apparatus, when the input content corresponding to each description is stored in a data base, a command such as COMPILE/LINK is executed after all descriptions are inputted. In such an apparatus, since there is a considerable time interval between the description input and error check by means of a compiler or output of the error message, it is necessary as the designer to memorize the meaning of description at a position to which error occurrence is indicated, or to make a check again on the specification thereof. Moreover, when a part of description is corrected, all the descriptions must be compiled again, thus, the working efficiency for debugging deteriorates.

Namely, in the text description method, since it is possible to execute the command such as COMPILE/LINK only after all descriptions are inputted and with a minute correction the COMPILE/LINK command have to be executed again, the debugging efficiency is very bad.

SUMMARY OF THE INVENTION

The present invention was made to solve the above-described problems of the prior art, therefore, it is an object thereof to provide an LSI design aid method and an apparatus thereof for facilitating and shortening such design work, which can realize data input onto the same editorial image plane by means of both diagrams and texts with making these two kinds of data be constructionally related to one another.

Another object of the present invention is to provide an LSI design aid method and an apparatus thereof which can realize an integral process of diagrams and texts, easy input operation and reduction of restriction on input descriptions.

Still another object of the present invention is to provide an LSI design aid method and an apparatus thereof which can realize successive real-time process to inputted language descriptions in accordance with inputted character strings.

Accordingly, the first feature of the present invention is a design aid apparatus for integrated circuits, including input means for inputting design data concerning a circuit to be designed as design data in the form of diagrams or design data in the form of language descriptions. The apparatus also includes design means for designing a circuit in accordance with the language description input design data, so as to prepare language description design circuit data, and preparing diagram design circuit data corresponding to the language description design circuit data when the input design data is in the form of language descriptions, or for designing a circuit in accordance with diagram input design data so as to prepare diagram design circuit data, and preparing language description design circuit data corresponding to the diagram design circuit data when the input design data is in the form of diagrams. The apparatus also includes a hold means for holding both the language description design circuit data and the diagram design circuit data from the design means.

Accordingly, in the storing means, both the circuit data based on language descriptions and diagrams are always prepared for one circuit to be designed. Thus, it becomes possible to display both the diagram information and language information alternately without any special display mode switching process, and to display both of the information at the same time.

The second feature of the present invention is a design aid apparatus for integrated circuits, including input means for setting and inputting control conditions, diagram input means for inputting design data concerning a circuit to be designed as a diagram design data, and first design means for designing conditional operation circuits based on the design data inputted from the diagram input means corresponding to the respective control conditions inputted from the input means, so as to prepare a first design circuit data. A second design means is included for designing a circuit unconditionally operated based on the design data inputted from the diagram input means, so as to a second design circuit data. The apparatus may also have display means for integrally displaying the first design circuit data of the conditional circuit designed by the first design means and the second design circuit data of the unconditionally operative circuit designed by the second design means.

According to this design aid apparatus, each circuit operated in accordance with each controlling condition is designed by each diagram input, so that the first design circuit data of the conditional circuit designed by the first design means and the second design circuit data of the unconditionally operative circuit designed by the second design means are integrally processed.

Accordingly, it becomes unnecessary to prepare a circuit for serving as a control system with the circuit diagram. Further, it becomes possible to design a circuit whose operation corresponds to respective control conditions. Thus, it also becomes possible to easily grasp the whole structure of a circuit to be designed. Accordingly, circuit design and circuit verification can be efficiently carried out.

The third feature of the present invention is a text processing section of an LSI design aid apparatus for inputting and processing language descriptions constructed in accordance with a predetermined grammar. This includes a data input section for inputting the descriptions and an analysis section for decomposing inputted character strings into sentences or token words respectively having independent meanings, storing the decomposed sentences or token words in a data base, and lexical analyzing and Syntax analyzing the decomposed sentences or token words. A data base holds data outputted from the data input section and analysis section. A control section controls the data input section and analysis section, whereby respective processes in the analysis section are carried out in real-time operation with the input operation of the data input section.

Accordingly, in the LSI design aid apparatus, the character string inputted from the data input section is lexical analyzed, and is Syntax analyzed, and every time each sentence is recognized at the analysis section, sentence data object is generated and each sentence is translated into internal data.

The fourth feature of the present invention is an LSI design aid apparatus for inputting circuit data concerning a logic circuit to be designed by means of diagrams and language descriptions, so as to facilitate the design. This apparatus includes a diagram-language integration editor which is able to edit input diagram data and input language description data into an integral data construction. Also included is an incremental compiler for carrying out Syntax analysis on design data inputted from the diagram-language integration editor successively by every sentence. An integration data base holds diagram information, language description information and connecting information concerning the circuit.

Accordingly, in the LSI design aid apparatus, the diagram-language integration editor inputs data to the integration data base, so as to hold them therein, and also gives the data to the incremental compiler. Incidentally, the diagram-language integration editor is able to edit input diagram data and input language description data into an integral data construction. Then, the incremental compiler divides the design data inputted by means of diagrams or language descriptions into every word or sentence and carries out Syntax analysis on the every word or sentence. The sentence referred to here means a unit that has confirmed input and output to be processed at a time, in either the case of the diagram input or the language input.

Moreover, all of the design data processed by the incremental compiler are stored in the integration data base. The integration data base has data construction in which are held figure information, language description information and connection information, respectively, concerning a circuit to be designed. A replacement display means replaces a diagram display of an optional portion of a circuit with a language description display.

These and other objects, features and advantages of the present invention will be more apparent from the following description of a preferred embodiment, taken in conjunction with the accompanying drawings.

BRIEF DESCRIPTION OF THE DRAWINGS

FIG. 2 is an explanatory diagram to show construction of a data base shown in FIG. 1;

FIGS. 3a to 8 are explanatory diagrams to show display examples in design using the design aid apparatus shown in FIG. 1.

DETAILED DESCRIPTION OF THE PREFERRED EMBODIMENTS

Figure 1:
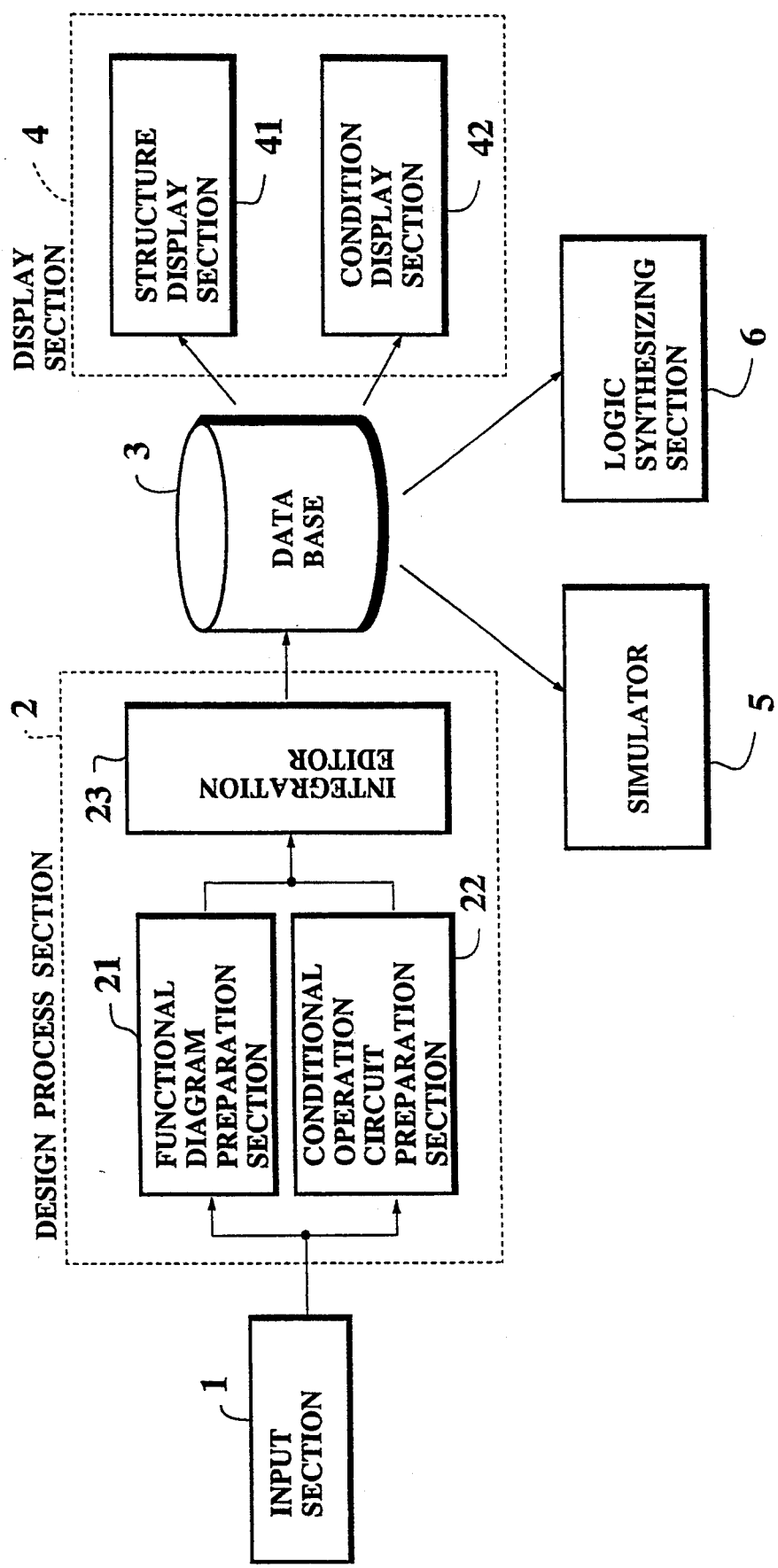
FIG. 1 is a block diagram to show construction of a design aid apparatus for integrated circuits, which is related to a first embodiment of the present invention.

FIG. 1 is a diagram to show construction related to a design aid apparatus for integrated circuits, which relates to a first embodiment of the present invention. The embodiment shown in the same drawing is so constructed that design concerning integrated circuits can be carried out with both a language input method and a diagram input method.

In FIG. 1, the design aid apparatus for integrated circuits includes an input section 1, a design process section 2, a data base 3 and a display section 4 as essential constructional elements.

The input section 1 receives design data composed of language descriptions, design data composed of diagrams and control conditions, then gives the design data to the design process section 2. Further, the input section 1 gives the control conditions to the design process section 2, data base 3 and display section 4, respectively, so as to control them for designing.

The design process section 2 includes a functional diagram preparation section 21, a conditional operation circuit preparation section 22 and an integration editor 23.

The functional diagram preparation section 21 prepares an editorial image plane sheet of design data concerning an unconditional operation circuit, such as a register and an arithmetic logic operation circuit in accordance with the design data composed of language descriptions or diagrams and given from the input section 1. On the sheet, differently from conventional design methods for integral circuits, for example, it is permissible for a plurality of input signals to be inputted to one input pin of a functional block. However, in such a case, it is necessary to set additional conditions. Moreover, there is a case where conditional sentences are inputted by means of languages descriptions. Here, the term "sheet" means a constructional unit of an editorial image plane when a desired circuit is designed either by combination of a plurality of functional blocks or by language descriptions. Therefore, one circuit is ordinarily constructed by a plurality of such sheets. The conditional operation circuit preparation section 22 prepares another sheet of design data concerning a circuit, operated under some conditions, in accordance with the control conditions to be given through the language input or with the design data to be given through the language input or diagram input from the input section 1.

To discriminate the sheet of design circuit data prepared by the conditional operation circuit preparation section 22 from the sheet of design circuit data prepared by the functional diagram preparation section 21, the former sheet is called "active sheet". All of the data on a design circuit on the sheet and the active sheet respectively prepared by the functional diagram preparation section 21 and the conditional operation circuit preparation section 22 are given to the integration editor 23 after verification of signal names, connection relations, relations between condition formulas and the like is given thereto. Moreover, all of the design circuit data are given to the integration editor 23, not only as information on diagrams or character strings, but also as functional specification information on functions of respective functional blocks, signal propagation states and lexical analysis data concerning design data composed of the language input.

Moreover, the integration editor 23 integrates the design circuit data prepared by the functional diagram preparation section 21 and the conditional operation circuit preparation section 22, and gives the integrated design circuit data to the data base 3. In operation, the integration editor 23 divides the design circuit data designed on the respective sheets based on the language input or the diagram input into sentence units, and further prepares new design circuit data with the divided sentences based on both of language descriptions and diagrams. Here, the term "sentence" means one process unit whose input and output is independently confirmed. Namely, in case that language design circuit data are obtained by circuit design by means of the language input, functional blocks and coordinates are given at each input operation so as to prepare diagram design circuit data corresponding to the language design circuit data. In the case that diagram design circuit data are obtained by circuit design by means of the diagram input, when related input-output signals are respectively given, language circuit design data corresponding to the diagram design circuit data are prepared at each input operation. Then, the prepared design circuit data are given to the data base 3. Accordingly, in the data base 3, the design circuit data composed of both languages and diagrams are always available for one circuit to be designed.

The data base 3 stores and holds the design circuit data given from the integration editor 23, and is constructed as shown in FIG. 2.

In FIG. 2, the data base 3 has a data object 31 provided for the sheet comprising the design circuit data prepared by the functional diagram preparation section 21, another data object 32 for the active sheet comprising the design circuit data prepared by the conditional operation circuit preparation section 22, and still another data object 33 for conditions of the active sheet. Moreover, a data object for the sentences prepared by the integration editor 23 and a sentence data object control table 34 for controlling a sentence data object 35.

Because of the data construction, among the design circuit data on the sheet prepared by the functional diagram preparation section 21, circuit diagram data conditionally designed by the active sheet or language data designed by the descriptions composed of conditional sentences are excluded from a sentence data object belonging to the data object 31 for the sheet. These are registered as a sentence data object belonging to the data object 32 for the active sheet, which is automatically prepared when the conditional sentence is inputted with descriptions. Accordingly, the sentence data object 35 belonging to the sheet data object is a data object for sentences, all of which are operated unconditionally. Moreover, the sentence data object 35 belongs to a plurality of active sheets which are different from one another in the operational condition. In addition to the respective sentence data objects, the data base 3 has a text data object 36 for language descriptions, and a functional block data object 37 and a connection information data object 38 for diagram information.

In such construction, the design circuit data, which are designed on the sheet and the active sheet and divided into sentences, are stored in an area corresponding to the sentence data object 35. Then, stored sentences are respectively designated by the sentence data object control table 34, while the sentence data object control table 34 is designated by the sheet data object 34 and the active sheet data object 32. The active sheet condition data object 33 is designated by the active sheet data object 32. Respective sentences stored in the sentence data object 35 are stored in the data objects 36 to 38, respectively, corresponding to the design circuit data composed of languages and diagrams. In such construction, since all circuit structures and operation designed are included in the sentence data object 35, design circuit data for general circuit construction, which contains both information on the unconditional operation circuit and on the conditional operation circuit, are stored therein. Moreover, each control condition and circuit operation concerning a conditional operation circuit are linked as one sentence, then stored in the data base 3. Then, the design circuit data stored in the data base 3 are respectively given to the display section 4. While the data base 3 stores and holds the design circuit data as mentioned above, the design circuit data stored therein are directly given to a simulator 5 or a logic synthesizing section 6 without being processed by any specific conversion means.

The display section 4 includes a structure display section 41 and a condition display section 42. In the structure display section 41, circuit structures designed with diagrams and language descriptions are all displayed, while in the condition display section 42 respective control conditions to the conditional operation circuits are displayed. The design contents displayed on the structure display section 41 are in direct liaison with the functional diagram preparation section 21. Namely, by the functional diagram preparation section 21, design work is carried out encompassing the entire construction of a circuit being designed. Circuit structures displayed on the structure display section 41 and control conditions displayed on the condition display section 42 correspond to each other. In order to designate the corresponding relations, for example, colors are used for discriminating each portion in such relation. Moreover, with respect to data independently displayed on the display sections 41, 42, color display is used for discriminating each important portion.

Next, a design procedure in which diagram input is carried out by using the above-mentioned apparatus is explained. First, in the functional diagram preparation section 21, the design circuit data are prepared based on the design data given from the input section 1. When a portion of a circuit is operated under some control condition, the active sheet of design circuit data is prepared for each control condition by the conditional operation circuit preparation section 22. Then, when a suitable condition is set to some data path, the data object to a sentence corresponding to the condition is separated from the sheet data object, and becomes a sentence data object to conditional data or the active sheet.

The active sheet has, as its attribute, each control condition, title and operation clock signal when the active sheet is retarded as one block, and is prepared by setting corresponding conditions.

Next, an example of methods for setting such conditions is described.

First, the THEN side of a condition formula is expressed as "A", and the ELSE side thereof is expressed as "ELSE A". Further, a logical sum of a logical product of "A" and "B" and "C" is expressed as "A & B ! C". When the condition signal value of condition "A" is 01, this state is expressed as "A=01", and when the condition "B" is nested in the condition "A". this state is expressed as "A>>>B".

Then the active sheet of design circuit data is prepared by carrying out such condition setting. For preparing the active sheet, two design methods are described below. The design mode is selected in accordance with the design content.

Figure 3A:
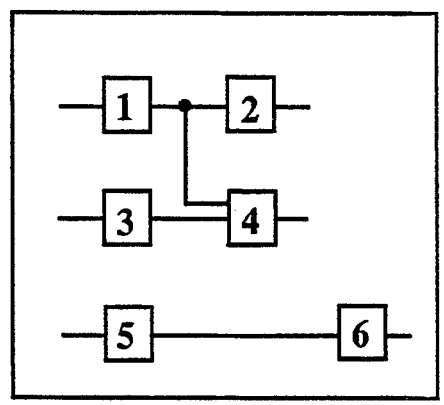
Figure 3B:
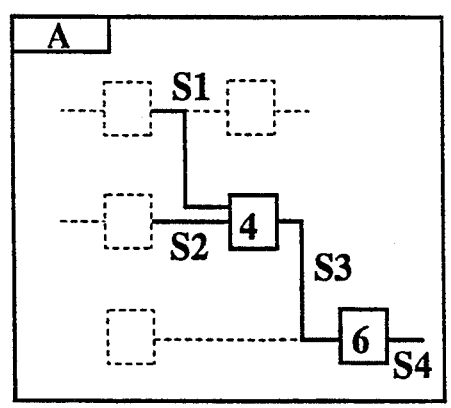

The first mode is a design mode for designing a circuit to be operated under conditions set by the above mentioned manner with reference to the sheet of design circuit data already prepared by the functional diagram preparation section 21 or the active sheet of design circuit data prepared by the conditional operation circuit preparation section 22. FIGS. 3a-3b show a design example by this mode.

FIG. 3a shows an example of the reference circuit sheets (hereinafter, this is called "base sheet"), while FIG. 3b shows a circuit with a solid line, which is operated when the condition "A" displayed on the left upper portion in the same drawing is established based on the base sheet.

In the sheet prepared by the functional figure preparation section 21 and the active sheet prepared by the conditional operation circuit preparation section 22, a sheet including a circuit to be operated under the condition "A" is designated among those corresponding to the higher rank condition. As the result, a base sheet as shown in FIG. 3a is displayed on the image plane. In such a state, a circuit to be operated under the condition A is selected by a mouse or the like. In FIG. 3b a function block 4 and its input signal, a connecting line between the function block 4 and a function block 8, and the function block 8 and its input signal are selected. As shown in FIG. 3b, the circuit operated under the condition A is designed with a solid line and specifically designated with a different display manner (for example, by colors). If expressed with language descriptions, the circuit displayed with diagrams in FIG. 3b is designated with descriptions comprising IF sentences as shown on the right side of FIG. 3b. In such a design mode, when the reference circuit is expressed with a plurality of sheets, active sheets are prepared for the respective sheets.

On the other hand, in the second design mode, when the reference circuit is expressed with a plurality of sheets, it is possible to design all circuits to be operated under a condition which is set without the base sheet on one active sheet. In such a design mode, only the connection information is contained as internal data.

Moreover, to the active sheet designed with the two design modes as described above, circuits to be operated under a higher or lower control condition are designed.

On designing such circuits, a higher or lower condition to an active sheet displayed on the image plane is designated. Then, the active sheet displayed on the image plane, or a sheet prepared by the functional figure preparation section 21, or another active sheet corresponding to the higher condition is designated as a base sheet. Thereafter, an active sheet is prepared in accordance with the above-described first design mode. In such a design manner, to clearly discriminate circuit operations corresponding to given conditions on the active sheet displayed on the image plane, a circuit operated under the original design condition, another circuit operated under a lower or higher condition, and the other circuits are respectively discriminated with colors in the display.

Figure 4A:
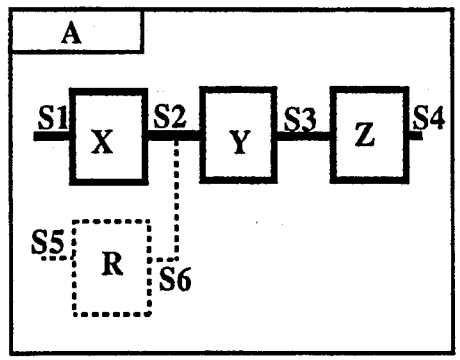
Figure 4B:
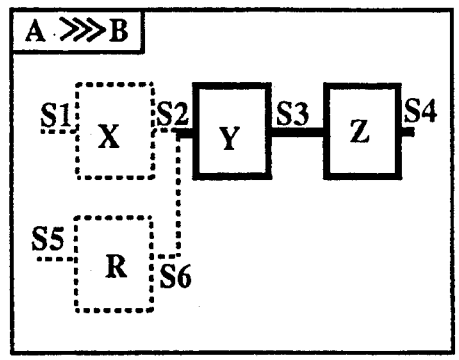
Figure 4C:
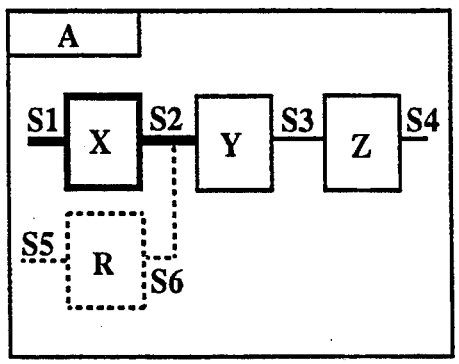

FIGS. 4a-4c show a design example of an active sheet to the lower condition. In the same drawing, an active sheet to condition "A" shown in FIG. 4a is used as a reference sheet, then a circuit portion to be operated under condition "A>>>B" where condition B is established under the condition "A" is selected with a mouse, thereafter an active sheet designated with a solid line in FIG. 4b is prepared. In FIG. 4b, a circuit portion to be operated under condition "A" higher than the condition "A>>>B" is designated with a broken line.

On the other hand, it is possible to make a design where the condition "A>>>B" is inputted directly to an optional sheets and an active sheet corresponding to the condition "A" is used as a base sheet. However, when the active sheet corresponding to the condition "A" is not already prepared, it is also possible to make a design in accordance with the first or the second design mode.

In this design mode, a circuit operation under the originally given condition, circuit operations under a higher and a lower condition, and the other circuit operations are displayed on the image plane with respectively different display manners. FIG. 4c shows a case where the active sheet to condition A is opened again after the active sheet to condition A>>>B is designed. In the same drawing, the circuit operation to the originally given condition is designated with a solid line, and still another to the condition lower than the actually designed condition is designated with a thin solid line, and the other portions are designated with a dotted line. Incidentally, these portions are respectively discriminated with colors.

It is possible to display the control relation to the circuit operation in an easily comprehensible manner by changing the display method in accordance with the nest state of the condition in such a way that the circuit portion operation corresponding to the actually designed condition is designated with the solid line, the circuit portion operation corresponding to the condition higher than the actually designed condition is designated with a broken line, the circuit portion operation corresponding to the condition lower than the actually designed condition is designated with the thin solid line, and the other portions are designated with the dotted line.

Figure 5A:
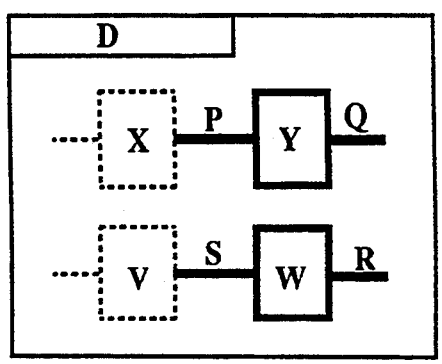
Figure 5B:
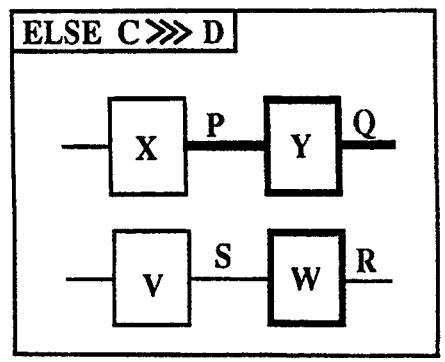

FIGS. 5a-5b show a design example of an active sheet corresponding to higher conditions. As shown in FIG. 5a, to an active sheet corresponding to condition "D", when a circuit is so designed as to be operated under higher condition "ELSE C" with respect to operational condition "Q=P", the condition "ELSE C" is inputted in a higher condition setting mode. As the result, another active sheet is prepared with respect to condition "ELSE C" as shown in FIG. 5b. In this case, the active sheet to condition "D" is used as the base sheet, and each circuit operation is discriminated with colors every time the corresponding operational condition is nested.

Figure 6:
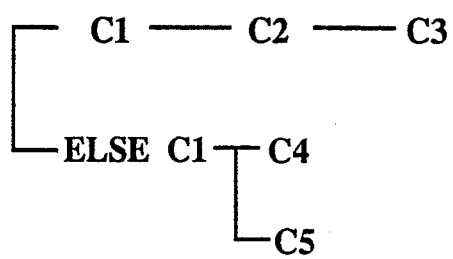

Since signal names and nest relations of the control conditions become extremely complex when the design contents are considerably large, it is also possible to display them on the image plane as a diagram, as shown in FIG. 6. In such a case, it is possible to replace respective conditions with some suitable titles or to automatically give new titles thereto. Moreover, when the respective conditions are displayed by replacement with titles, each corresponding relation between them is also displayed at the same time.

Accordingly, since each control condition is displayed on the image plane so as to design each circuit operation by using the active sheet corresponding to the displayed condition, the relation between respective control conditions and circuit operations can be clearly grasped. Moreover, when a specific circuit condition is designated to the whole circuit diagram, an operational circuit portion corresponding to the condition can be discriminated with color display in the whole circuit diagram.

Also in case that the control conditions are displayed in a diagram as shown in FIG. 6, this design manner can be realized by designating each specified condition with a mouse. Moreover, in the conditional operation circuit diagram, it is also possible to display each control condition on the circuit diagram. In such a display manner, there are two display modes. In one mode, each control condition is always displayed with respect to each function block, and in the other, the control condition is displayed when required.

Next, the case where design work is carried out using language descriptions is explained.

Figure 7A:
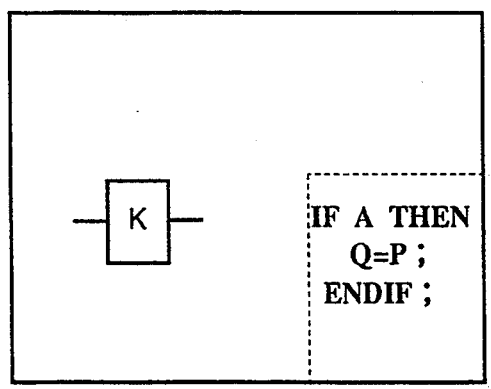

FIG. 7 shows a design example where a circuit is designed by means of language input. In the same drawing, when a sentence for expressing some condition, such as IF sentence of CASE sentence, is inputted by means of language descriptions, an active sheet is immediately prepared by the conditional operation circuit diagram preparation section 22 as shown in FIG. 7a. At the time, conditional sentences are displayed on a designated area in the image plane. In addition, a circuit diagram is displayed with figures thereon. When addition or correction on circuit operation is given to the active sheet prepared in such a manner, though this work can be carried out directly on a sheet shown in FIG. 7a, it is also possible to carry out the work by designating the conditional sentence "A", so as to display the corresponding active sheet on the image plane. In such a case, descriptions corresponding to the conditional sentence "A" are displayed on the active sheet, as described on the original sheet. This operation is similar to that in the first design mode in which is used the active sheet by figure input.

Figure 7B:
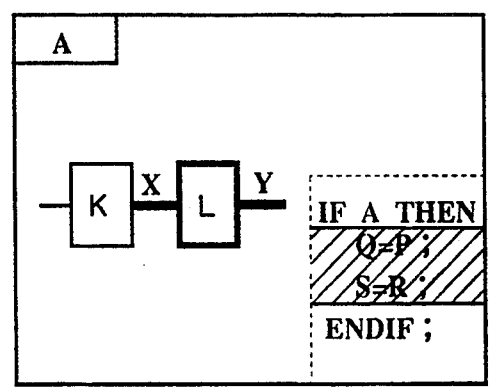
Figure 7C:
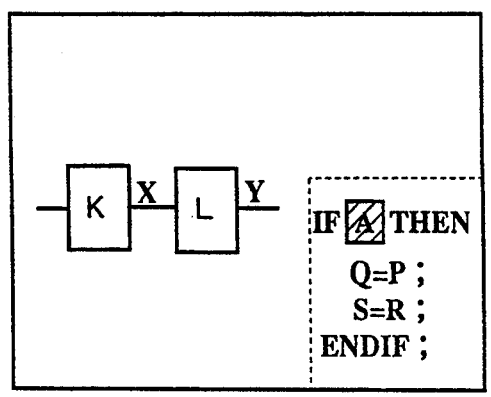

FIG. 7b shows a design example based on an operational condition Y=X given by means of figure input in accordance with description input of a new operational condition S=R in the circuit diagram shown in FIG. 7a. In such a case, the effective area of condition "A" which can be added to the description input is suitably restricted, and the design by means of figure input is carried out in the first or the second design mode. FIG. 7c shows a circuit operation designed in the above-mentioned manner. A suitable mark is given to each figure or description showing each circuit operation corresponding to each operational condition, and when the cursor indicates a text showing some conditional formula by means of descriptions, circuit operations corresponding to the indicated condition are displayed by means of circuit diagrams and descriptions on the image plane with discriminating colors.

However, with respect to the input operation, when the design work on the same circuit operation is carried out by means of figures and descriptions under the same condition, an error message is outputted. Incidentally, when inputted by means of language descriptions, it is also possible to display circuit operations corresponding to the same condition in one sheet.

FIG. 8 shows a design example in which a subwindow is used. In the same drawing, text data for one sheet in a window 90, in which are shown design data for one sheet, are displayed on a designated area 01 thereof. The area 01 is designated by indicating a predetermined start point on the sheet, and the inputted text data are successively displayed from the designated start point. Then, a circuit operated under condition "A", which is displayed on the area 91, is displayed on the subwindow 92. Further, the design data displayed on the subwindow 92 become data on a functional sheet.

In the above embodiment, since all the circuit operations to be designed are stored as the same data construction in the data base through the integration editor 23, integrated circuit construction, which contains both the unconditional operation circuits and conditional operation circuits, can be displayed. Moreover, since the control conditions and the circuit operations are designed correspondingly to one another, each circuit operation to each condition or each condition to each circuit operation can be easily extracted.

Furthermore, since the data objects of language information and of diagrammatical information are provided in the data base corresponding to respective sentences to be prepared by diagram input and language input, the diagram information and the language information can be alternately displayed without any switching operation, or displayed on the same image plane at the same time.

Accordingly, it becomes unnecessary to construct a control circuit for controlling complex circuit operations, so that design speed can be improved. Besides, since the circuit structure of the data path system is displayed with circuit diagrams and the process control flow is displayed with language descriptions, the relations between control conditions and circuit operations can be clearly understood, so that visual verification of the circuits can be easily carried out.

As stated above, according to the first embodiment, since the circuit design is carried out by integrating each circuit to be designed under each control condition, or since the circuit design is carried out by grasping the relation between circuit data to be designed with both diagram input and language input, it becomes possible to facilitate the design work for integrated circuits, to enhance the design work efficiency, and to reduce the design term.

Hereinafter, a second and the third embodiment related to the present invention will be described with reference to the drawings.

The second and a third embodiments relate to a text process section for an LSI design aid apparatus for processing inputted language descriptions in accordance with the character strings in real-time operation. In particular, the second embodiment is used for processing inputted character strings by decomposing them into corresponding token units, while the third embodiment relates to a process for decomposing them into corresponding sentence units. Incidentally, in the first embodiment, the text process section is included in the integration editor section 23.

First, the second embodiment relating to a process for decomposing into token units is explained with reference to FIGS. 9 and 10.

Figure 9:
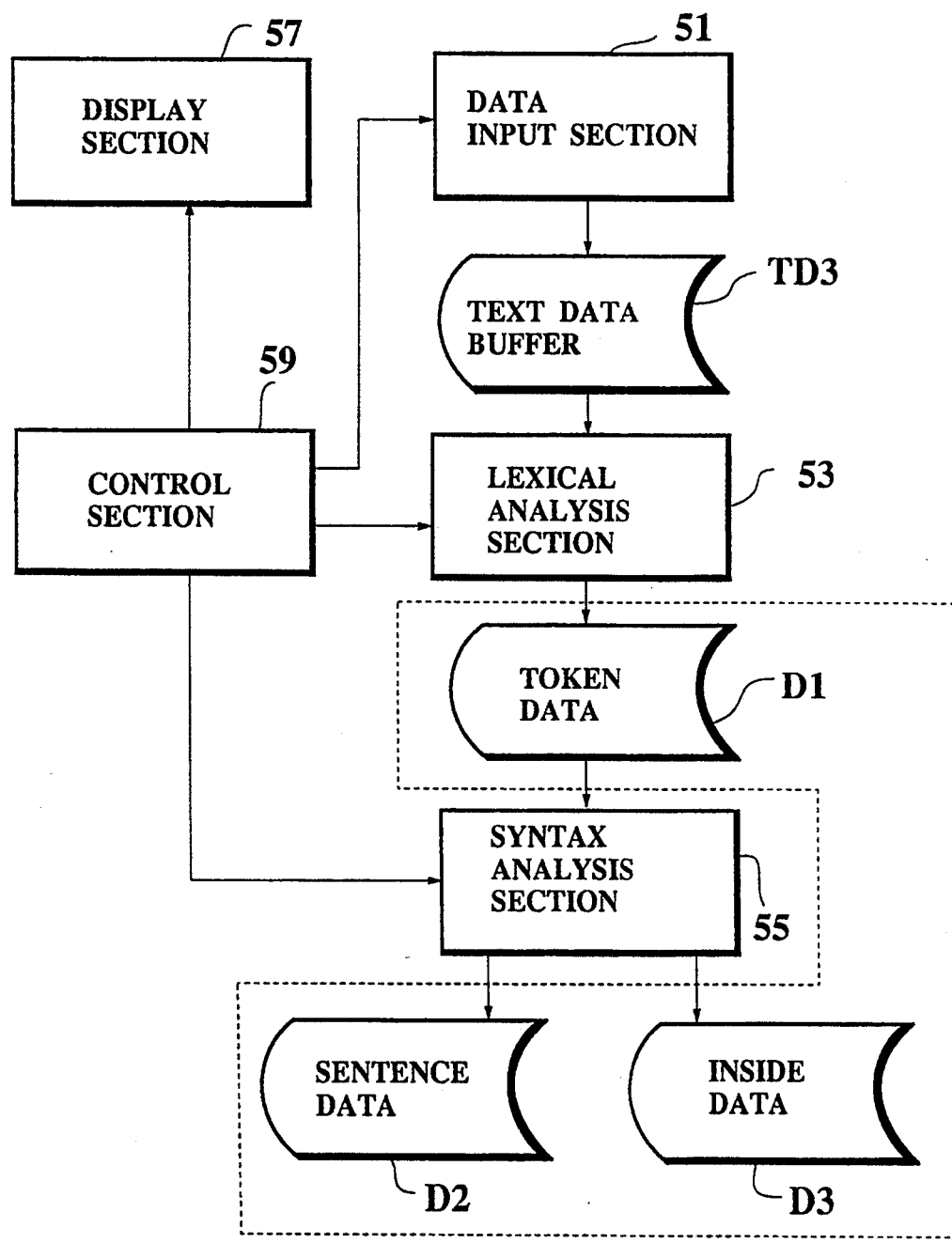
FIG. 9 is a constructional diagram of a text process section included in an LSI design aid apparatus for realizing a second embodiment of the present invention.
Figure 10:
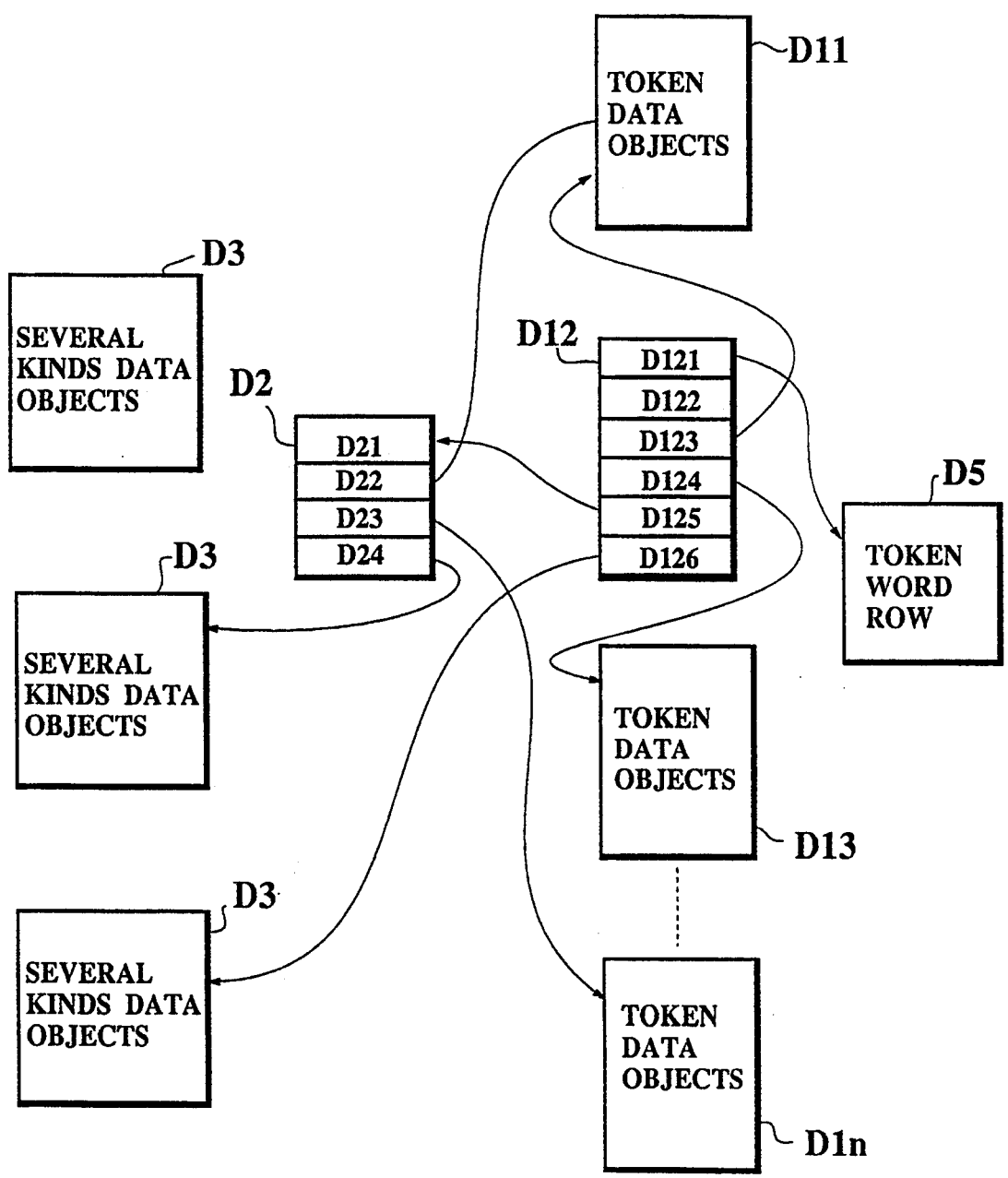
FIG. 10 is a diagram to show internal construction of a data base for realizing the second embodiment.

FIG. 9 is a diagram showing a text process section for an LSI design aid apparatus of the second embodiment related to the present invention. In the same drawing, the text process section includes a data input section 51 for inputting text data, a lexical analysis section 53 for dividing inputted data into corresponding token units and transferring them to a data base 61, a Syntax analysis section 55 for recognizing sentences from the output result of the lexical analysis section 53 and analyzing the sentence structure thereof. The data base 61 is for holding data outputted from respective sections, display section 57 is for suitably displaying the contents of the data base 61 in accordance with requests of an operator, and control section 59 is for controlling the respective sections.

The data structure of data dealt with in the text process section is explained with reference to FIG. 10. FIG. 10 shows an internal structure of the data base 61 to realize the second embodiment. As shown in the same drawing, with respect to text data inputted from the data input section 51, respective characters contained in the data are successively analyzed by the lexical analysis section 53, then divided into corresponding token units. The term "token" referred to here designates an element for constructing a sentence, and means a sentence row or word row independently having some meaning. In the data base 61, data objects D11 to D1n are provided for respective token units. For example, a token data object D12 comprises a pointer D121 and token attribute D122 corresponding to a token character string D5, pointers 123 and 124 respectively corresponding to token data objects D11 and D13 before and after the token data object D12, a pointer D125 corresponding to a sentence data object D12 having the token data object D12 as a constructional element, and a pointer 126 corresponding to various data tables D3 produced after the sentence analysis (the construction of pointer 126 depends on the token attribute). When a certain sentence is recognized from relations between each pair of the token data objects D11 to D1n related to the token units divided by the lexical analysis section 53, the Syntax analysis section 55 produces the sentence data object D2. Moreover, the sentence data object D2 includes sentence attribute D21, a pointer D22 corresponding to the first token data object D11 which constructs the sentence, and a pointer D23 corresponding to the last token data object D1n. Moreover, the sentence data object D2 includes a pointer D24 corresponding to the various data objects D3 which produced from the sentence analysis result by the Syntax analysis section 55.

Next, operation of the text process section having such construction and such data structure is explained.

First, character strings inputted from a key board of the data input section 51 are temporarily held on a text data buffer TDB. Then, the text data held on the text data buffer TDB are transferred to the token character string D5 of the token data objects D11 to D1n whenever each token unit is recognized by the lexical analysis section 53. Subsequently, when sentences are recognized from combinations of these token units at the Syntax analysis section 55, the sentence data object D2 is produced. Moreover, the Syntax analysis is carried out based on the produced sentence data object D2, then the analysis result is developed into the internal data D3. When correction is given, data produced based on corrected sentences are once transferred to the text data buffer TDB, then returned to the data base 61 again, after the correction is added thereto.

In such a manner, according to the second embodiment, since inputted language descriptions are stored into the data base 61 for respective token units, it becomes possible to cope with the correction to the inputted descriptions only by correcting token units and a portion of the data base 61 each related to the correction. Thus, it is not necessary to analyze again all the descriptions.

The third embodiment relating to the process for decomposing into sentence units is explained with reference to FIGS. 11 and 12.

Figure 11:
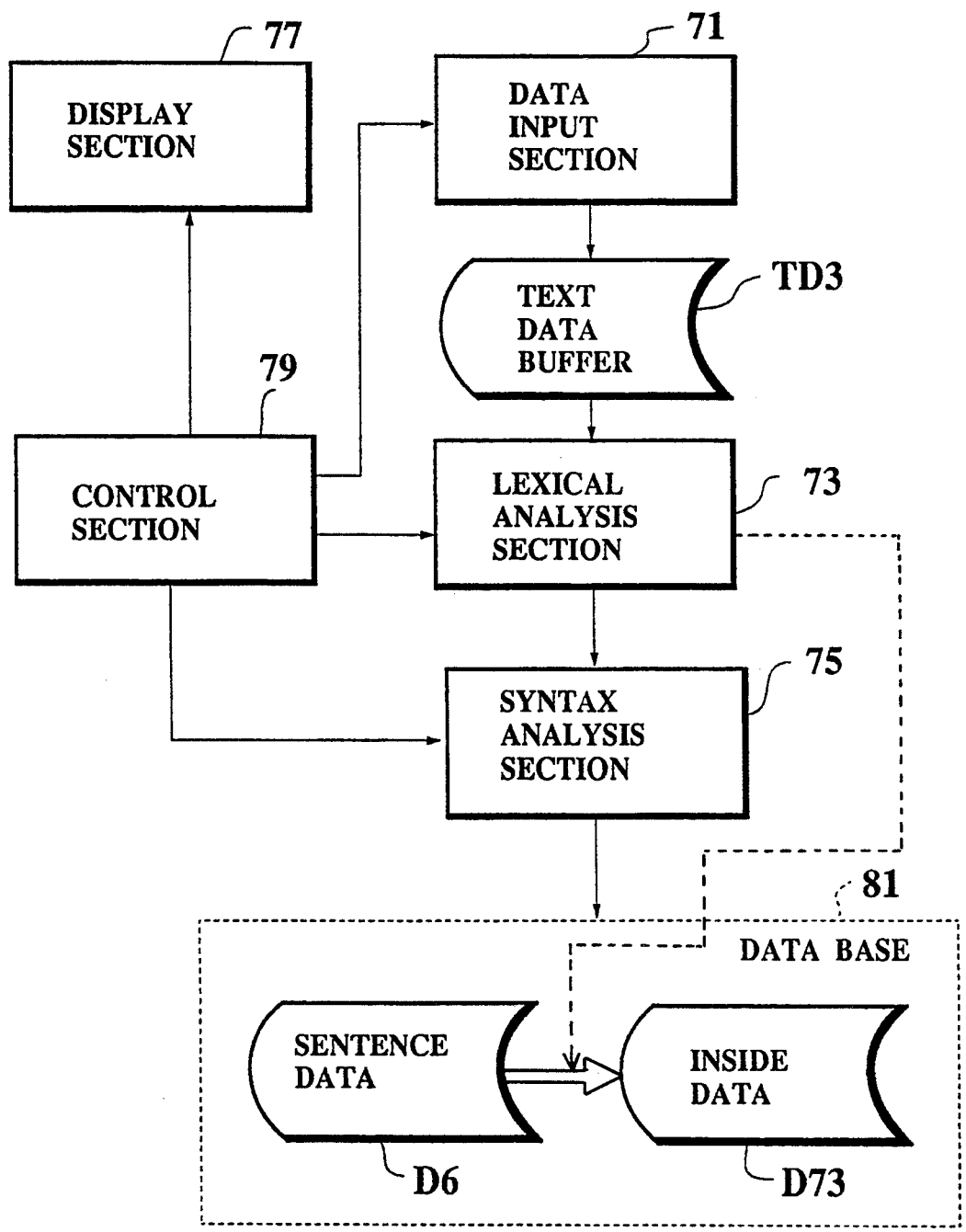
FIG. 11 is a constructional diagram of a text process section of an LSI design aid apparatus for realizing a third embodiment of the present invention.
Figure 12:
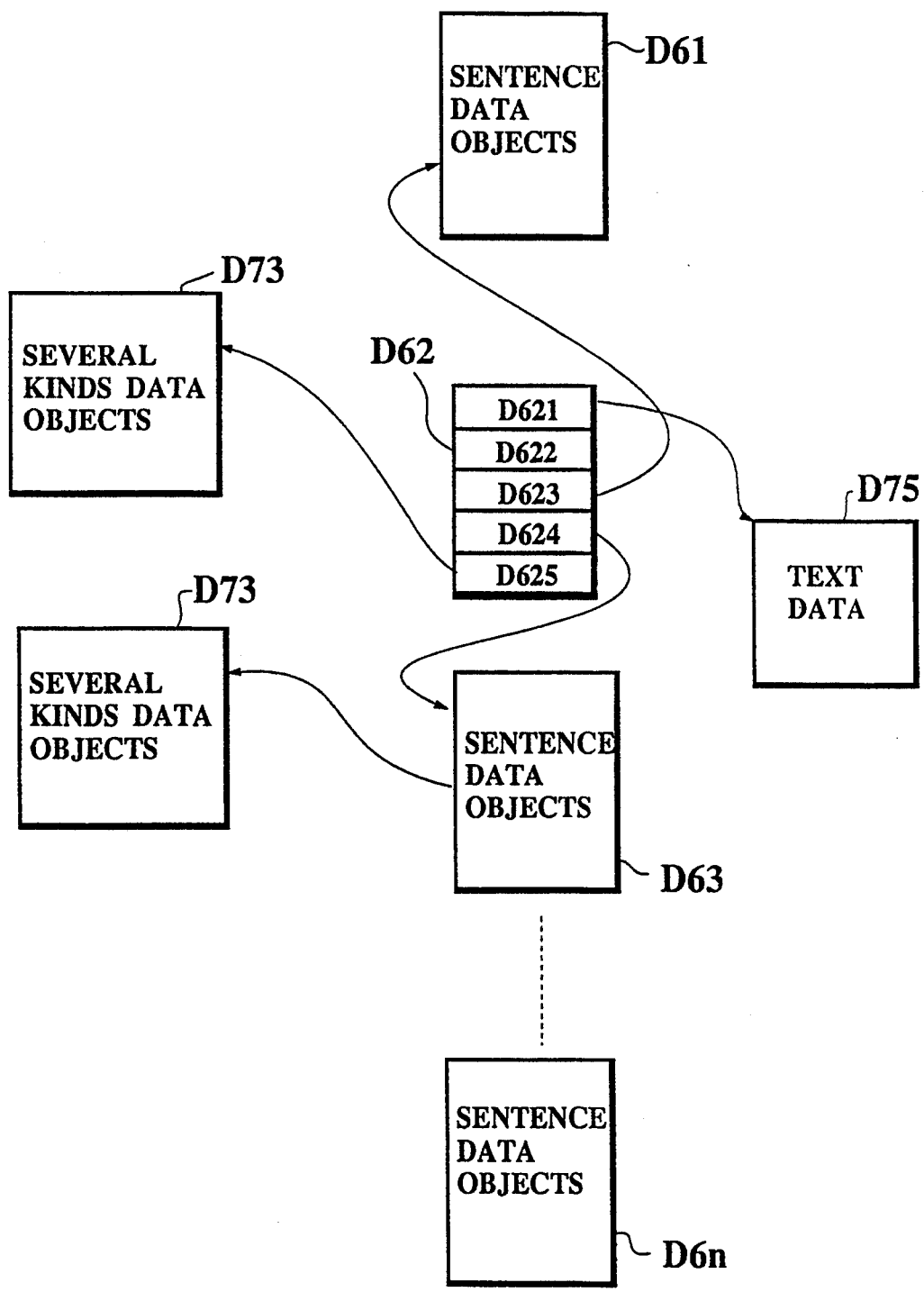
FIG. 12 is a diagram to show internal construction of a data base for realizing the third embodiment.

FIG. 11 is a diagram showing a text process section for an LSI design aid apparatus of the third embodiment related to the present invention. In the same drawing, the text process section includes a data input section 71 for inputting text data, a lexical analysis section 73 for carrying out the lexical analysis on inputted data, a Syntax analysis section 75 for analyzing each of sentences from the output result of the lexical analysis section 73, a data base 81 for holding data outputted from respective sections, a display section 77 for suitably displaying the contents of the data base 81 in accordance with requests of an operator, and a control section 79 for controlling the respective sections.

The data structure of data dealt with in the text process section is explained with reference to FIG. 12. FIG. 12 shows an internal structure of the data base 81 to realize the third embodiment. As shown in the same drawing, when inputted characters are successively analyzed so as to recognize corresponding sentences, data objects D61 to D6n are produced. For example, a data object D62 comprises a pointer D621 and token attribute D622 to text data D75 corresponding to the recognized sentences, pointers 623 and 624 respectively corresponding to sentence data objects D61 and D63 before and after the data object D62, and a pointer D625 corresponding to various data tables D73 produced after the sentence analysis (the construction of pointer D625 depends on the attribute of sentence).

Next, operation of the text process section having such construction and such data structure is explained.

First, character strings inputted from a key board of the data input section 71 are temporarily held on a text data buffer TDB. Then, the text data held on the text data buffer TDB are transferred to text data D75 of the respective sentence data objects D61 to D6n whenever each sentence unit is recognized by the lexical analysis section 73. Subsequently, the Syntax analysis is carried out based on the produced sentence data D6, then the analysis result is developed into the internal data D73. When correction is given, data produced based on corrected sentences are once transferred to the text data buffer TDB, then returned to the data base 81 again, after the correction is added thereto.

In such a manner, according to the third embodiment, since inputted language descriptions are stored into the data base 81 for respective sentence units, it becomes possible to cope with the correction to the inputted descriptions only by correcting sentence units and a portion of the data base DB each related to the correction. Thus, it is not necessary to analyze again all the descriptions.

A fourth embodiment relates to an LSI design aid apparatus. It can carry out input operation by means of diagrams and texts on the same editorial image plane, and further can facilitate the design work and reduce the design time by making both data be in close relation to each other on the data construction.

Figure 13:
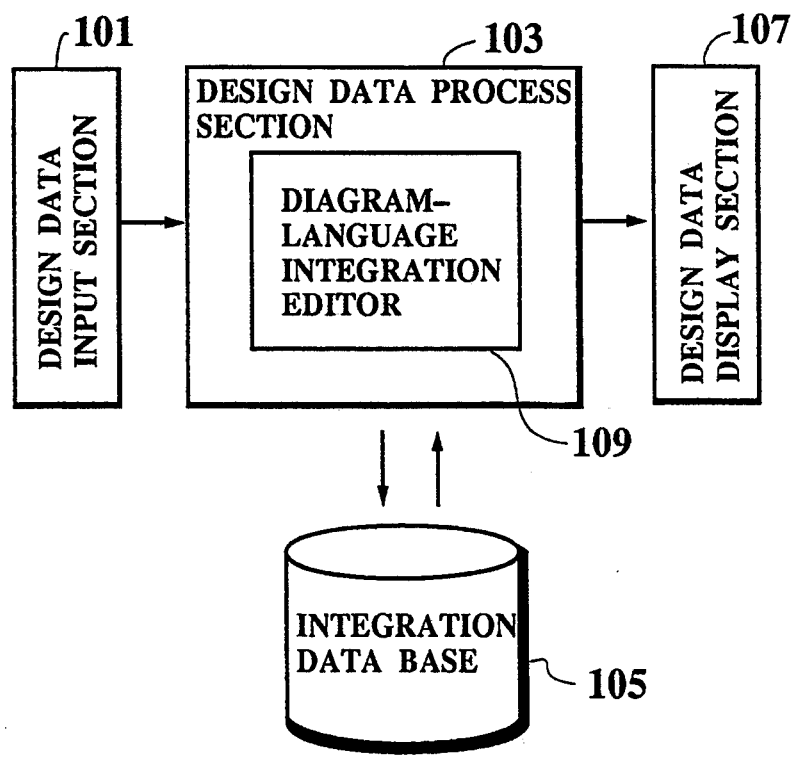
FIG. 13 is a block diagram to show construction of an LSI design aid apparatus, which is related to a fourth embodiment of the present invention.

FIG. 13 is a block diagram showing construction of an LSI design aid apparatus related to the fourth embodiment of the present invention. In the same drawing, the LSI design aid apparatus includes a design data input section 101, a design data process section 103 including a diagram-language integration editor 109, an integration data base 105 and a design data display section 107.

The data input section 101 is a section for inputting data by means of a key board or a mouse, and gives inputted design data to the design data process section 103. The design data section 103 comprises the diagram-language integration editor 109, which is called "sheet" and is used for enabling input edition of diagram data and language integration editor 109 has an incremental compiler as stated in the first and the second embodiment of the present invention for carrying out the sentence construction analysis on the design data inputted by means of diagrams or language descriptions based on the corresponding token units or sentence units. The term "sentence" referred to here means one process unit whose input and output is certainly examined in the related operation, in either the case of diagram input or language input. Then, the design data processed by the design data process section 103 are all stored in the integration data base 105. The integration data base 105 is provided with diagram information, language description information and connection information on circuits to be designed, and has data construction which is common to the other subsystems on function verification concerning the LSI design aid environment, logic synthesis and functional test generation. Moreover, commands executed by a user are successively displayed on the image plane by the design data display section 107.

Ordinarily, when the design work by means of circuit diagrams is carried out, diagram blocks provided with specific operation functions are prepared in advance as libraries between the input and the output system, so as to arrange and connect them to one another on a sheet.

Figure 14:
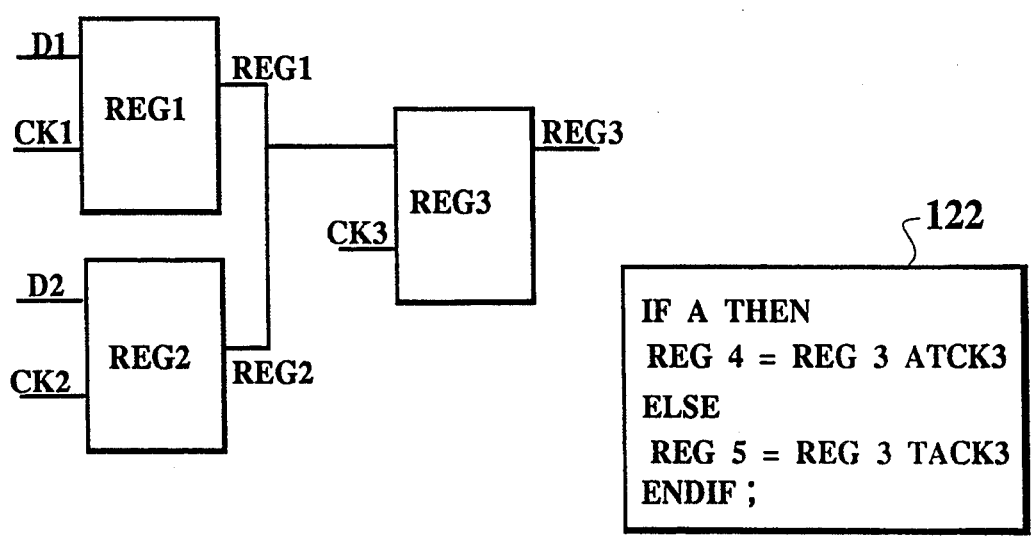
FIG. 14 is a diagram to show an example of circuit design carried out by the LSI design aid apparatus related to the fourth embodiment.

To the contrary, in this embodiment, as shown in FIG. 14, a text editor 122, which can be arranged at an optional position on the same circuit design sheet and has an area of variable size, is opened to enable input by means of LSI design language descriptions. Incidentally, the text editor 122 is not a window, and the menu on design commands by means of diagrams or language descriptions provided therefor is so constructed that when the mouse cursor is in the text editor 122, a text editorial menu is automatically set. When the cursor is out thereof, the diagram editorial menu is set. Moreover, data inputted on sheet are successively checked and analyzed on input operation, then stored in the integration data base 105.

In this embodiment, a diagram block for design language input is used anew. Since inputted by means of texts, the block is called "TEXT block". This TEXT block is used for designing relations between input and output signals related thereto. The block does not have a specific circuit operation, which is provided in a special block, such as a register block. The TEXT block is discriminated with colors from other function blocks on display. Thus, a designer can arrange the TEXT block with other function blocks for expressing circuit parts prepared as libraries on the same sheet and transmit operational signals thereto by connecting it to other blocks. Incidentally, the TEXT block is registered as a library in which the number of input and output pins are set in advance.

Each sheet on which the TEXT block is arranged has a special name, and is called "instance". When a description editorial command of the TEXT block is executed, and an instance of the TEXT block is clicked, a text editor for language description input is displayed in the vicinity of the block. The text editor is successively subjected to a grammar check as well as the text editor on sheet, and is stored in the integration data base 105 after the Syntax analysis. Moreover, the display of text editor can be hidden by means of key input, for example [CTRL]+D, and it is also possible to display it again so as to edit it.

Hereinafter, a design example where the TEXT block is used is explained.

Figure 15:
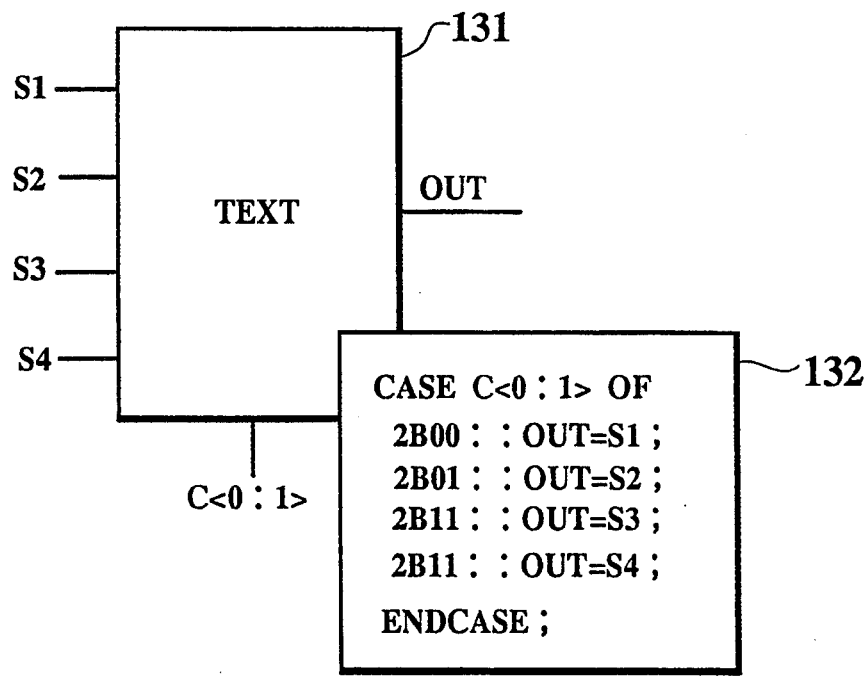
FIG. 15 is a diagram to show an example where a text block is used for controlling signal propagation.

FIG. 15 shows an example in which the TEXT block is used for control of signal propagation. In the construction shown in the same drawing, each signal can be propagated by selecting a suitable data path in accordance with a value of 2-bit control signal C. In a text editor 132, when a signal having a different name from that of the input and output signal is used, a warning message is outputted. Moreover, in the editorial menu of the text editor 132, text insertion, elimination, copy, alteration of text frame size and setting of signal attribute are included. The display of the text editor 132 can be also hidden by key input, for example [CTRL]+D.

Figure 16:
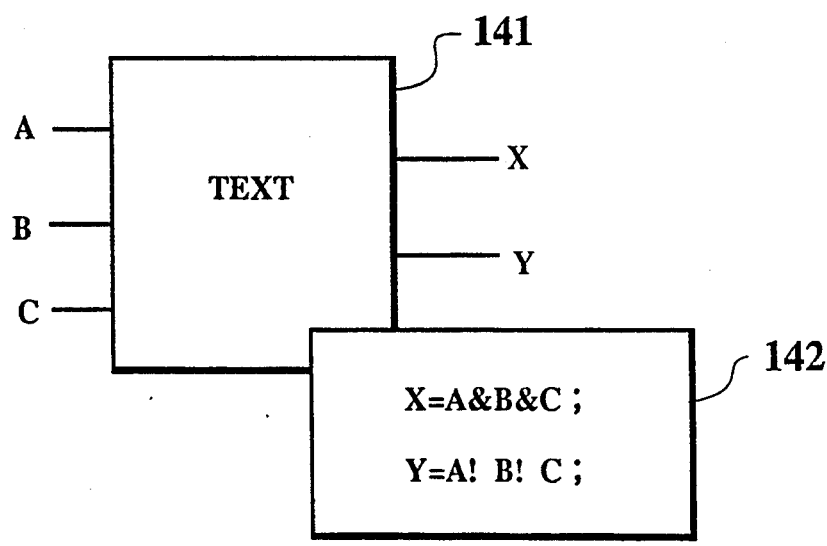
FIG. 16 is a diagram to show an example where a text block is used for inputting logic operation formulas.

FIG. 16 shows an example in which the TEXT block is used for input of a logical operation formula. In this case, a designer can optionally describe relations between input and output as shown in the same drawing.

Figure 17:
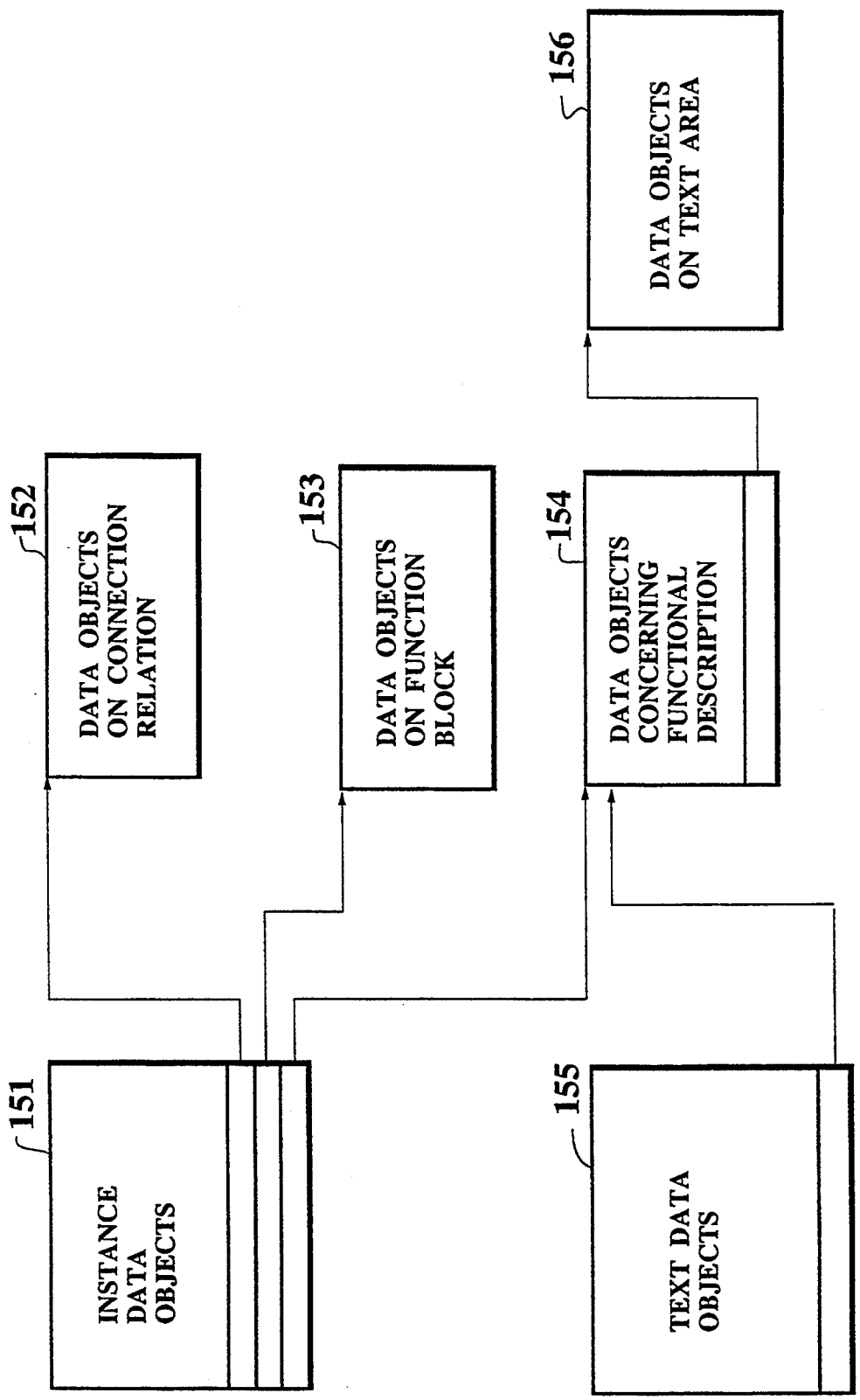
FIG. 17 is a diagram to explain data construction showing between instance and language description.

FIG. 17 shows data construction to show a relation between the instance and the language description each arranged on sheet on the integration data base 105. In the same drawing, an instance data object 151 is an object concerning instance arranged on sheet. The data object 151 has a data object 152 on connection relation in which is stored information on where the input and output pins of instance are respectively connected, a data object 153 on function block in which is stored information on which functional block library is used by the instance, and a data object 154 concerning functional description corresponding to the instance. Data inputted to a text area by the text editor compose the data object 154 concerning functional description described in the area through the data object 155 on text area. Then, data constructed in the actual text mode are stored as character strings in the text data object 156. Incidentally, the instance data object 151 comprises circuit data inputted by means of diagrams, while the text area data object 155 comprises circuit data inputted by means of language descriptions.

Description input data in the TEXT block are transferred from the instance data object 151 to the text data object 156 through the functional description data object 154. Thus, when it is necessary to display the internal description of the text editor once, displayed by designating the TEXT block again, the contents of the text data object 156 can be displayed by opening the text editor.

Also to each instance, in the case where the instance is designated, in contrast, by preparing the functional description data object 154 and the text data object 156 by generating sentences as functional descriptions when an input and output signal is decided, it is possible to display sentences generated at the time by opening the text area.

As stated above, in this embodiment, functional descriptions in an any given area in a design circuit diagram can be displayed, even in the middle of designing, by the method where language descriptions corresponding to a plurality of instances are outputted together.

A fifth embodiment relates to an LSI design aid apparatus in which diagram input and text description input are integrated, the input operation can be carried out with ease, and the description input is not so restricted as in the prior art.

Figure 18:
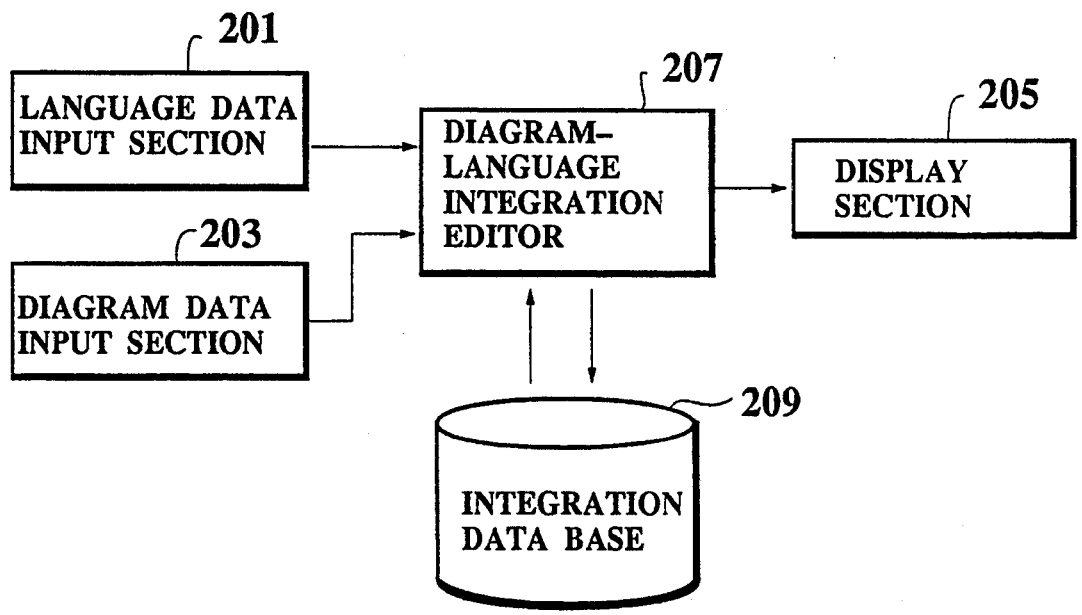
FIG. 18 is a block diagram to show construction of an LSI design aid apparatus, which is related to a fifth embodiment of the present invention.

FIG. 18 is a diagram of an LSI design aid apparatus related to the fifth embodiment of the present invention. In the same drawing, the LSI design aid apparatus includes a language data input section 201 for inputting design information composed of language descriptions, a diagram data input section 203 for inputting design information composed of diagrams, a display section 205 for integrating and displaying both the design information composed of language descriptions and diagrams, a diagram-language integration editor 207 for editing diagram data and language data in the same dimension, and an integration data base 209 for holding inputted and edited diagram information, language description information and connection information concerning a circuit to be designed.

Next, a manner of input edition according to this embodiment is explained with reference to drawings.

Figure 19:
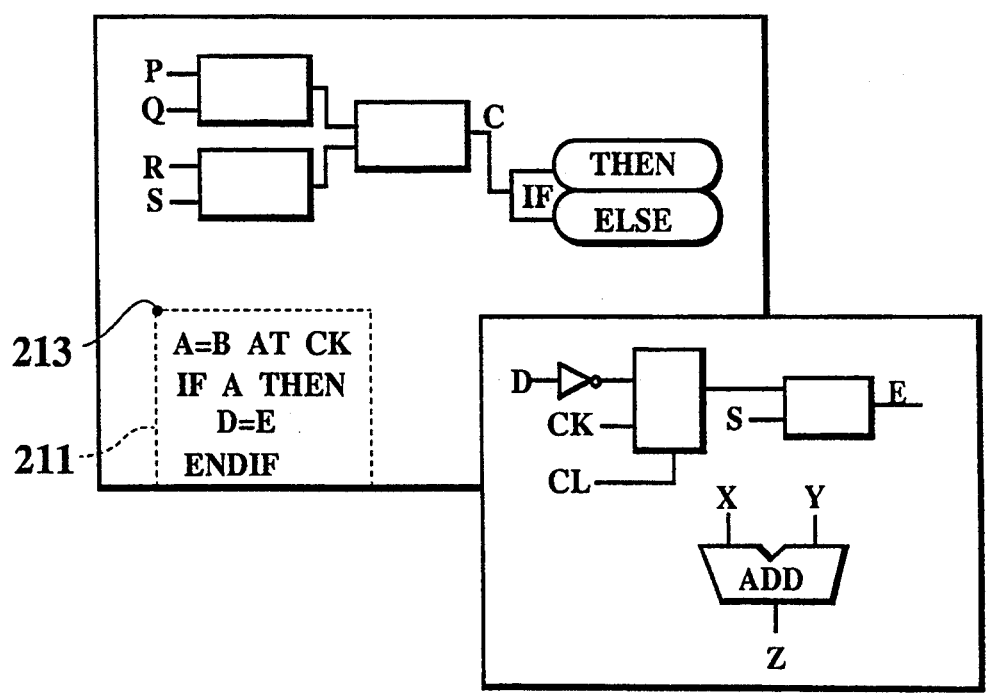
FIG. 19 is a diagram to show an example of circuit design carried out by the LSI design aid apparatus related to the fourth embodiment.

FIG. 19 shows an example of a display image plane on which the input edition according to this embodiment is shown.

In this embodiment, an area 211 for inputting language descriptions is a part of a diagram data input area. When an optional point 213 on the diagram input area is designated as a standard of the language description input area, a language description display area corresponding to a predetermined standard number of characters is decided for one line. When language descriptions are successively inputted to the decided area, a new next line is successively assured whenever the input for one line is completed. The completion of one line input is recognized by operation of a return key or the like. In this case, when the character number for one inputted line exceeds a predetermined number of characters for one line area, the width of character number of the language description area is extended by the inputted character number. Accordingly, it becomes possible to realize an apparatus in which the text description input is not restricted by the size of display area thereof.

When the whole design circuit area is displayed by extension or reduction, the language description area is maintained at a fixed size. In this case, this area is decided on the basis of the standard point 213. However, when the language description area overlaps the other diagram area by reduction, or when the reduction ratio exceeds a predetermined value, the language description area is symbolized. Namely, in this case, only the outer frame of the area is designated and the description contents are not displayed. In such a case, when a command to see the description contents is executed, a window is opened independently, so that description contents of a designated language description area are displayed therein. Moreover, when the diagram display area is shifted, the language description area is also shifted with the movement of the diagram display area on the basis of the standard point 213. Since a display can be realized keeping the positional relation between the diagram data and the language description data, there can be provided an apparatus which can carry out a display operation such that the language description data and the diagram data, both of which are related to one another, can be displayed adjacently.

Figure 20:
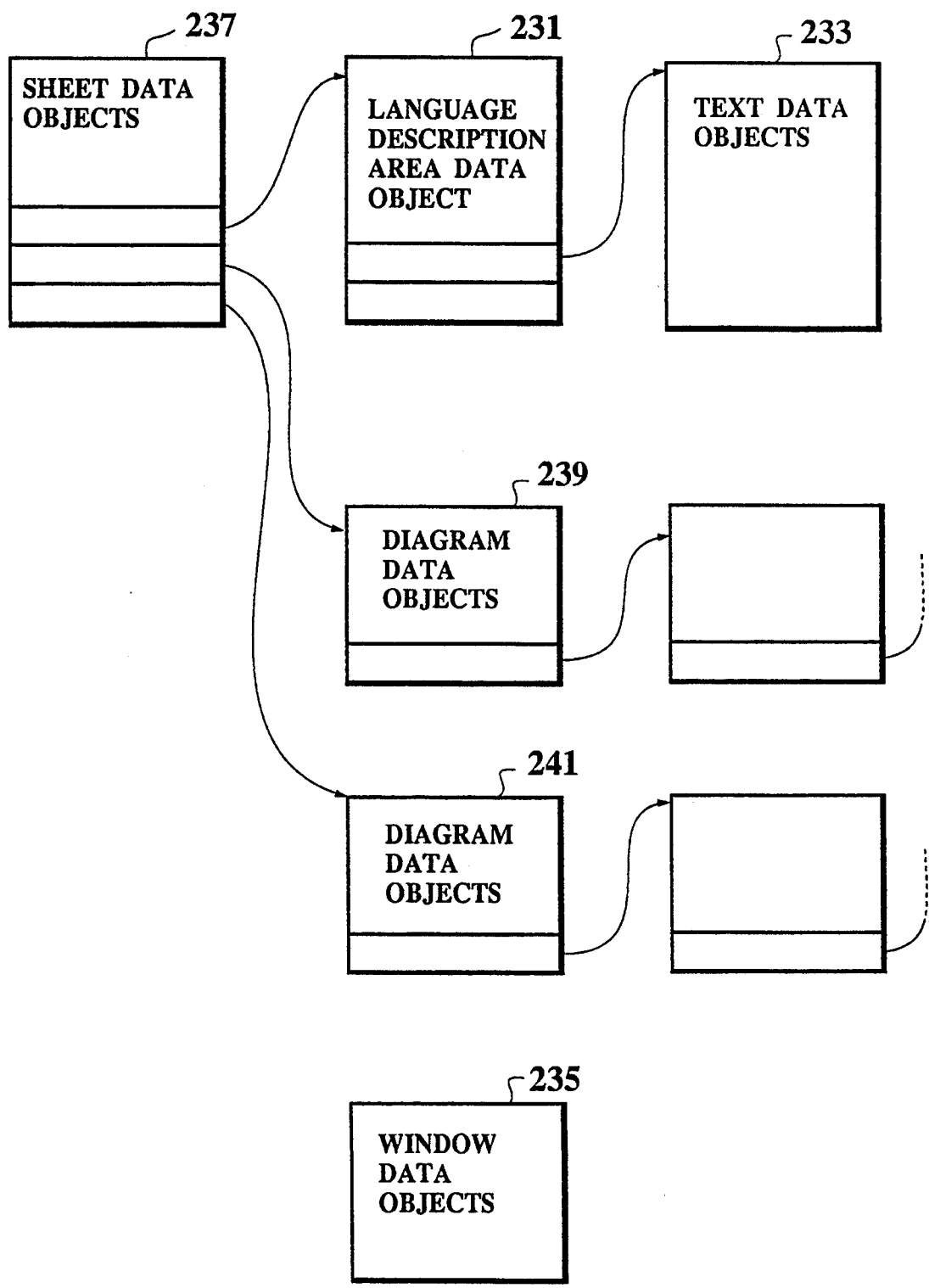
FIG. 20 is a diagram to show internal construction of a data base for realizing the fifth embodiment.

The data structure of the integration data base 209 for realizing the LSI design aid apparatus related to this embodiment is explained with reference to FIG. 20.

In the same drawing, a language description area data object 231 is an object which relates to the language description area and holds data, such as coordinates of the standard point, character number for one line, and inputted line number. The language description area data object 231 has a link chain construction in which is included a pointer corresponding to a text data object 233 holding text data concerning respective lines. A window data object 235 is a data object for holding window control data, in which is held information, such as position and size of a window on the image plane, extension or reduction ratio of display size, and coordinates in an area displayed in a window. A standard value of reduction ratio, which is necessary for symbolizing the language description area, is also included in the window data object 235.

Diagram data objects 239 and 241 for holding diagram data have link chain structures respectively. A sheet data object 237 is provided as a data object for controlling all diagram data on the display. The sheet data object 237 has a pointer corresponding to the forefront of the link chain holding respective diagram data, and a pointer corresponding to the forefront of the language description area data object 231.

In such construction, the overlap, between the diagram data and the language description data is always checked on display reduction. When such overlap is detected, the language description area is symbolized, and only the outer frame thereof is displayed. Moreover, the outer frame is reduced in size with the display reduction, in order to avoid the overlap of the description display area to the peripheral diagram display area. In the second to the fifth embodiments of the present invention, in the text process section of an LSI design aid apparatus for successively processing inputted language descriptions in accordance with inputted character strings, since inputted character strings are decomposed into token units or sentence units, and each token unit or sentence unit is stored in the data base, when language descriptions based on a predetermined grammar are inputted, the inputted data are respectively processed at the same time as the input operation. Simultaneously, the check on errors of the data is immediately carried out. When errors exist, a message for designating the contents is outputted at once. Therefore, an LSI design aid apparatus for performing input operation with high efficiency is provided.

When some correction is given to the inputted data, only the data given the correction are analyzed again, and only data related to the analyzed data are altered. Therefore, it is not necessary to compile them all. This provides an LSI design aid apparatus which can complete the design work in a short time.

Since these embodiments may be so constructed that the diagram input and the text input can be carried out in the same editorial image plane, and both of the input data are closely related to one another on the data structure, it becomes possible to make a design in which diagram input, suitable for expressing data path structure concerning a circuit to be designed, and language input, suitable for expressing a data flow control system concerning the circuit, are suitably integrated. This provides an LSI aid apparatus which can realize diversified, easy, and highly efficient circuit design.

Since the design environment comprises an integrated data structure in which the diagram input data and the text description data are coexist, an LSI design aid apparatus, which can always adjacently display diagram data and text description data both of which are related to one another and can realize less restricted text description input is provided.

Various modifications will become possible for those skilled in the art after receiving the teachings of the present disclosure without departing from the scope thereof.

What is claimed is:

1. A method of designing integrated circuits in a design aid apparatus, the method comprising the steps of:
   (a) setting and inputting to an input means of said apparatus control conditions and design data for a circuit to be designed;
   (b) in a first design means, functionally designing a conditional operation circuit based on the design data inputted from the input means for each control condition inputted from the input means, so as to prepare first design circuit data;
   (c) in a second design means, functionally designing an unconditional operation circuit over an area which is not designed by the first design means, based on the design data inputted from the input means, so as to prepare second design circuit data; and
   (d) in an integration means, integrating the first design circuit data of the conditional operation circuit designed by the first design means and the second design circuit data of the unconditional operation circuit designed by the second design means.

2. A design aid apparatus for designing integrated circuits, comprising:
   (a) input means for setting and inputting control conditions and inputting design data for a circuit to be designed;
   (b) first design means for functionally designing a conditional operation circuit based on the design data inputted from the input means for each control condition inputted from the input means, so as to prepare first design circuit data;
   (c) second design means for functionally designing an unconditional operation circuit over an area which is not designed by the first design means, based on the design data inputted from the input means so as to prepare second design circuit data; and
   (d) integration means for integrating the first design circuit data of the conditional operation circuit designed by the first design means and the second design circuit data of the unconditional operation circuit designed by the second design means.

3. The design aid apparatus according to claim 2, further comprising:
   means for displaying a circuit structure by means of diagrams designed in accordance with the integrated design circuit data by the integration means, and control conditions of the language descriptions and the designed conditional operation circuit.

4. The design aid apparatus according to claim 2, wherein
   the first design means comprises a conditional operation circuit preparation section for preparing as an active sheet design data on a circuit operation under some condition, the active sheet being a standard unit of an editorial image plane, in accordance with the design data and the control conditions from the input means.

5. The design aid apparatus according to claim 4, wherein
   the second design means comprises a functional diagram preparation section for preparing as a sheet design data on a circuit operated unconditionally, the sheet being a standard unit of the editorial image plane, in accordance with the design data from the input means.

* * * * *